(12) United States Patent
Hong

(10) Patent No.: US 7,936,191 B2
(45) Date of Patent: May 3, 2011

(54) START-UP RESET CIRCUIT AND RELATED METHOD

(75) Inventor: Yun-Jan Hong, Tai-Chung (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 118 days.

(21) Appl. No.: 11/963,857

(22) Filed: Dec. 24, 2007

(65) Prior Publication Data

US 2008/0150595 A1 Jun. 26, 2008

(30) Foreign Application Priority Data

Dec. 25, 2006 (TW) .............................. 95148816 A

(51) Int. Cl.
*H03L 7/00* (2006.01)
(52) U.S. Cl. ........ 327/143; 327/142; 327/198; 327/202; 327/218
(58) Field of Classification Search .......... 327/142–143, 327/198, 199–203, 208–218
See application file for complete search history.

(56) References Cited

U.S. PATENT DOCUMENTS

| | | | | |
|---|---|---|---|---|
| 5,202,908 A | * | 4/1993 | Hatada | ............................ 377/64 |
| 5,414,307 A | | 5/1995 | Brandmaier | |
| 5,654,658 A | * | 8/1997 | Kubota et al. | ................. 327/202 |
| 5,719,878 A | * | 2/1998 | Yu et al. | ........................ 714/726 |
| 6,198,318 B1 | | 3/2001 | Bhaskaran | |
| 6,348,827 B1 | * | 2/2002 | Fifield et al. | .................. 327/278 |
| 6,388,479 B1 | | 5/2002 | Gupta | |
| 2006/0012409 A1 | * | 1/2006 | Wadhwa et al. | ............. 327/143 |
| 2006/0267653 A1 | * | 11/2006 | Fulkerson | ..................... 327/208 |
| 2007/0001733 A1 | * | 1/2007 | Branch et al. | ................. 327/218 |

FOREIGN PATENT DOCUMENTS

| | | |
|---|---|---|
| CN | 1694241 | 11/2005 |
| JP | 2003324340 | 11/2003 |
| TW | 293103 | 12/1996 |
| TW | 491435 | 6/2002 |
| TW | 587366 | 5/2004 |
| TW | M278957 | 10/2005 |
| TW | I244261 | 11/2005 |

\* cited by examiner

*Primary Examiner* — Lincoln Donovan
*Assistant Examiner* — Shikha Goyal
(74) *Attorney, Agent, or Firm* — Winston Hsu; Scott Margo

(57) ABSTRACT

A start-up reset circuit includes a flip-flop and a clock signal generator. The clock signal generator generates a first clock signal and a second clock signal, wherein there is a phase difference between the first clock signal and the second clock signal. The flip-flop receives an operation voltage and has a setup time, and further includes an input terminal to receive the first clock signal, a clock input terminal to receive the second clock signal, and an output terminal to output a reset signal, wherein the setup time corresponds to the operation voltage.

18 Claims, 6 Drawing Sheets

START-UP RESET CIRCUIT AND RELATED METHOD

BACKGROUND OF THE INVENTION

1. Field of the Invention

The present invention relates to start-up reset circuits and related methods, and more particularly, to start-up reset circuits and related methods adaptive to low voltage systems.

2. Description of the Prior Art

In current electronic devices, in order to make the circuit therein operate normally, it is typical to send a start-up reset signal (which is typically labeled as "RESET") to all circuit components that require reset operations to have correct initial values, to ensure correct further operations.

A conventional start-up reset circuit utilizes a comparator to compare a reference voltage with a voltage source $V_{dd}$ within an integrated circuit (IC), wherein the reference voltage can be generated by a bandgap voltage generator. Architecture and functions of the bandgap voltage generator are well known in the art, and therefore not explained in detail here. FIG. 1 illustrates a conventional start-up reset circuit 100. As shown in FIG. 1, the conventional start-up reset circuit 100 comprises a comparator 102 and a bandgap voltage generator 104. Once the circuit starts up, the comparator 102 compares the voltage source $V_{dd}$ and a reference voltage $V_{ref}$ from the bandgap voltage generator 104 to output a start-up reset signal RESET. During this, in an initial phase of the circuit start-up, the voltage source $V_{dd}$ continuously increases while the reference voltage $V_{ref}$ is kept constant. If the voltage source $V_{dd}$ is lower than the reference voltage $V_{ref}$, the start-up reset signal RESET is set as logic 1 (i.e. a high voltage level here) to perform operations of start-up reset; otherwise, the start-up reset signal RESET is set as logic 0 (i.e. a low voltage level here) to stop performing operations of start-up reset.

According to the prior art, as the chip area required for the circuit thereof (for example, the comparator or the bandgap voltage generator) is large, the power consumption is correspondingly high. In addition, as semiconductor technologies progress rapidly, the internal circuit scale of ICs becomes smaller and smaller, and internal circuits and circuit configurations of various components are more complicated. Accordingly, semiconductor processes are forced to approach a tiny scale such as the order of nanometers. As a result, the voltage source $V_{dd}$ required for the internal circuits becomes smaller and smaller accordingly. Regarding this, the start-up reset circuit of the prior art is not able to operate normally under a lower value of the voltage source $V_{dd}$.

As mentioned, the start-up reset circuit of the prior art is complicated and the chip area required is large. Furthermore, the power consumption is correspondingly high. Therefore, it is necessary to solve the above problems and other problems that will be faced when semiconductor processes are forced to approach the tiny scale mentioned above.

SUMMARY OF THE INVENTION

It is an objective of the claimed invention to provide start-up reset circuits and related methods, so as to correctly send a reset signal to all circuits that require start-up reset before normal operations.

It is another objective of the claimed invention to provide start-up reset circuits and related methods, so that chip areas and power consumption of circuits can be properly controlled under corresponding target values.

It is another objective of the claimed invention to provide start-up reset circuits and related methods, so as to meet requirements for circuits operating with low operation voltages.

According to embodiment(s) of the claimed invention, a start-up reset circuit is disclosed. The start-up reset circuit comprises: a clock signal generator, for generating a first clock signal and a second clock signal, wherein there is a phase difference between the first and the second clock signals, and a frequency of the first clock signal and a frequency of the second clock signal are substantially the same; and a flip-flop, for receiving an operation voltage and having a setup time, comprising an input terminal to receive the first clock signal, a clock input terminal to receive the second clock signal, and an output terminal to output a reset signal, wherein the setup time corresponds to the operation voltage.

According to embodiment(s) of the claimed invention, a start-up reset circuit is disclosed. The start-up reset circuit comprises: an oscillator, for generating a first clock signal and a second clock signal, wherein there is a phase difference between the first and the second clock signals; and a flip-flop, coupled to the oscillator. The flip-flop comprises: a first latch circuit for receiving the first and the second clock signals, wherein the first latch circuit samples the first clock signal by utilizing the second clock signal to output a sample signal; and a second latch circuit for receiving the sample signal and the second clock signal, wherein the second latch circuit samples the sample signal by utilizing the second clock signal to output a reset signal.

According to embodiment(s) of the claimed invention, a generation method for generating a start-up reset signal is disclosed. The generation method comprises: generating a first clock signal and a second clock signal, wherein there is a phase difference between the first and the second clock signals, and a frequency of the first clock signal and a frequency of the second clock signal are substantially the same; utilizing an input terminal of a flip-flop to receive the first clock signal, wherein the flip-flop has a setup time, and the setup time corresponds to an operation voltage received by the flip-flop; utilizing a clock input terminal of the flip-flop to receive the second clock signal; and utilizing an output terminal of the flip-flop to output a reset signal.

According to the above descriptions, no matter what kind of voltage is utilized by a circuit, the start-up reset operation(s) can be properly performed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
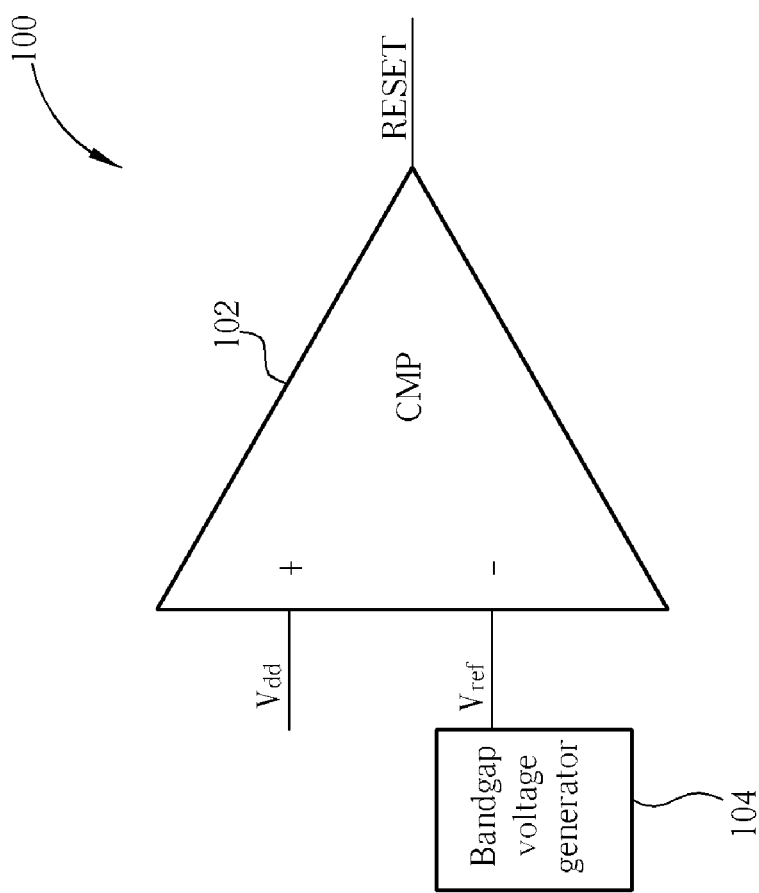
FIG. 1 illustrates a start-up reset circuit according to the prior art.
Figure 2:
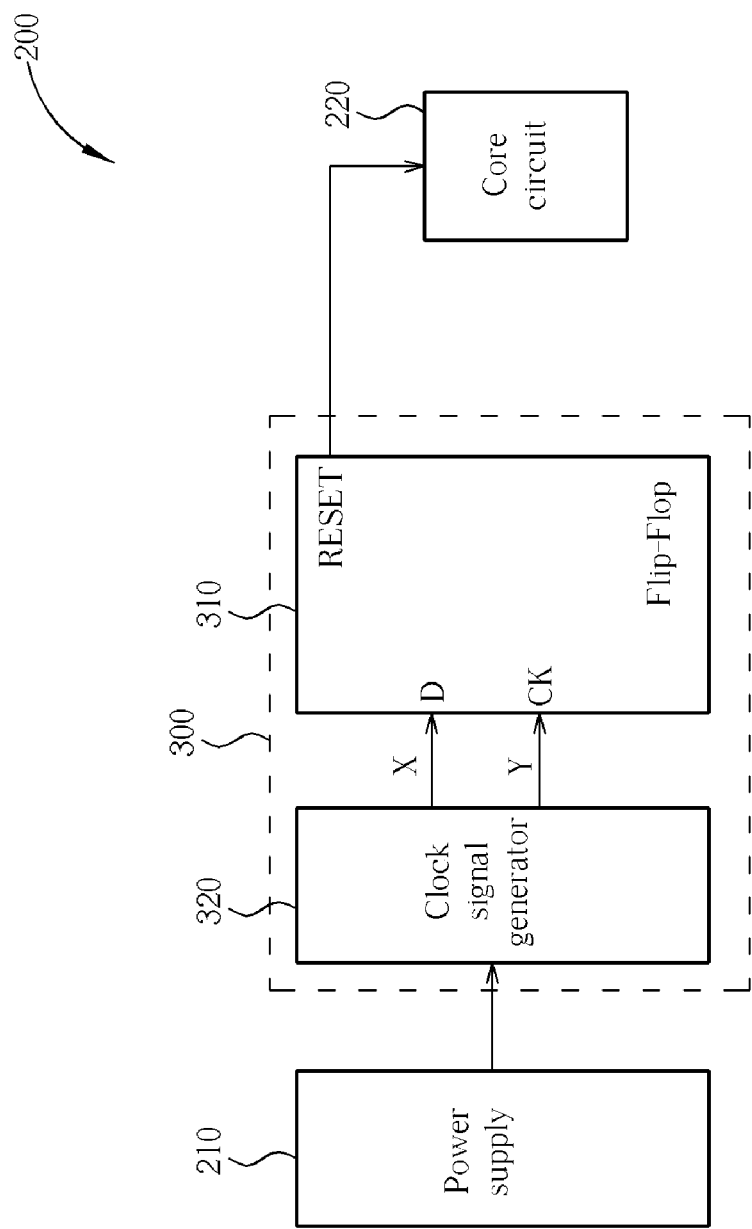
FIG. 2 illustrates a complete functional bock diagram of a complete circuit utilizing a start-up reset circuit according to one embodiment of the present invention.

FIG. 2 illustrates a complete functional bock diagram of a complete circuit 200 utilizing a start-up reset circuit 300 according to one embodiment of the present invention. As shown in FIG. 2, the complete circuit 200 comprises the start-up reset circuit 300 and a core circuit 220. According to an implementation choice of this embodiment, the start-up reset circuit 300 and the core circuit 220 are positioned within an integrated circuit (IC). Both the start-up reset circuit 300 and the core circuit 220 receive an operation voltage $V_{dd}$, which is derived from a power supply 210.

Figure 3:
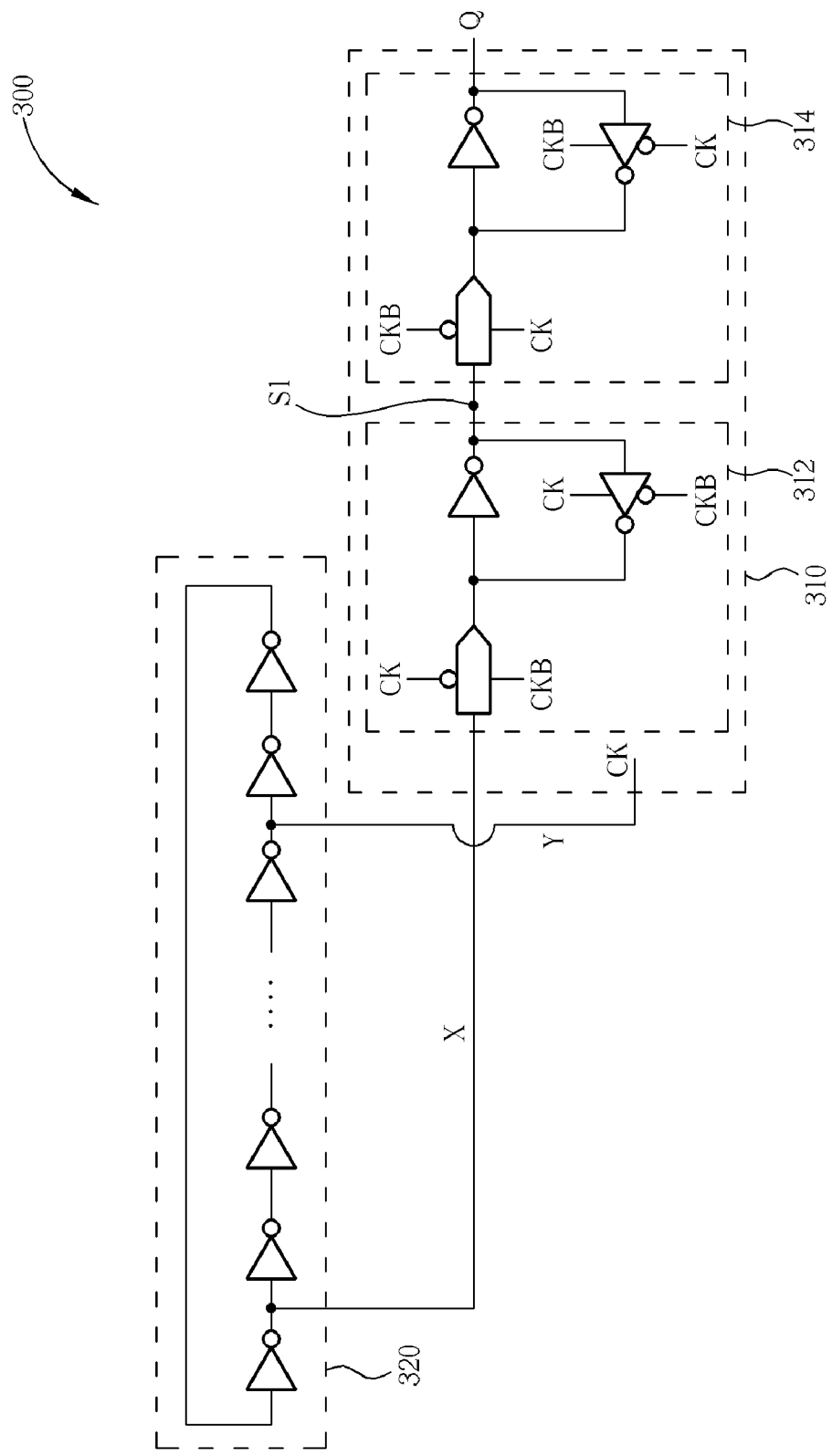
FIG. 3 is a functional bock diagram of the start-up reset circuit shown in FIG. 2 according to one embodiment of the present invention.

FIG. 3 is a functional bock diagram of the start-up reset circuit 300 shown in FIG. 2 according to one embodiment of the present invention. As shown in FIG. 3, the start-up reset circuit 300 comprises a flip-flop 310 and a clock signal generator 320, where the flip-flop 310 comprises a first latch 312 and a second latch 314, and the flip-flop 310 comprises a data input terminal D, a clock enabling input terminal CK, and a data output terminal Q, where the data input terminal D and the clock enabling input terminal CK are respectively coupled to two different phases X and Y from the clock signal generator 320, and the data output terminal Q is utilized for outputting a start-up reset signal RESET. The clock signal generator 320 can be implemented according to different implementation choices. For example, the clock signal generator 320 can be a multiple phase oscillator. In another example, the clock signal generator 320 comprises a clock signal generation unit and an adjustable delay circuit, the clock signal generation unit is utilized for generating a clock signal, the adjustable delay circuit delays the clock signal to generate a delayed clock signal, and there is a phase difference between the clock signal and the delayed clock signal.

Figure 4:
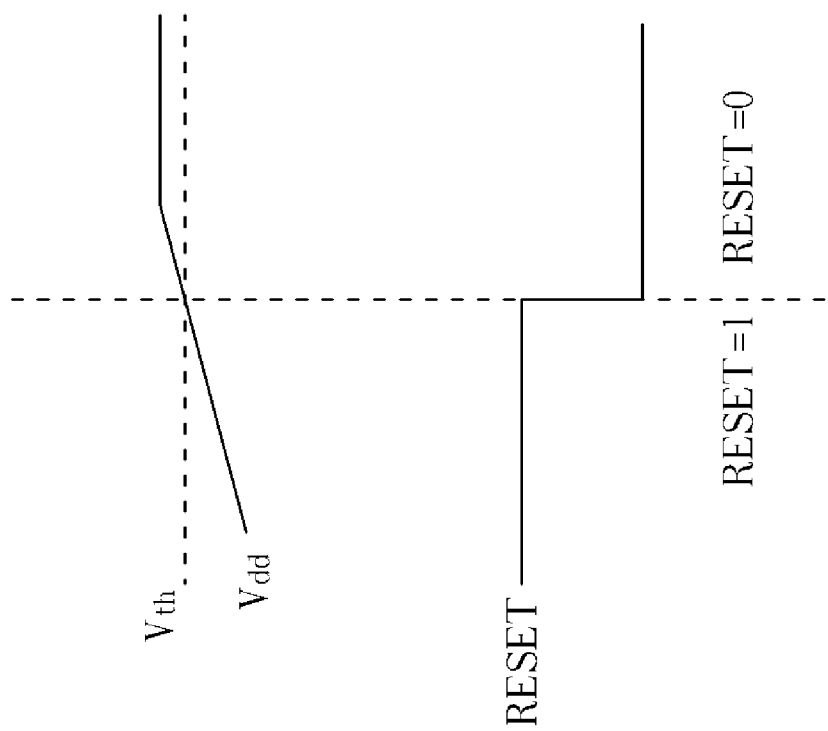
FIG. 4 illustrates waveforms of voltages of related signals during circuit start-up according to one embodiment of the present invention.

Generally speaking, a voltage source of a circuit can be coupled to a large capacitor for reducing the interference of noise. Therefore, during circuit start-up, the voltage of the voltage source gradually increases with a ramp waveform from 0 till the voltage is charged up to $V_{dd}$. If the voltage of the voltage source has not reached a threshold voltage $V_{th}$, the data output terminal Q is logic 1. If the voltage of the voltage source reaches the threshold voltage $V_{th}$, the data output terminal Q will be logic 0. FIG. 4 illustrates waveforms of voltages of related signals during circuit start-up according to one embodiment of the present invention.

Here, an equation well known in the art is utilized as a supplementary explanation, so as to demonstrate why different values of the voltage source $V_{dd}$ that drives the flip-flop 310 cause different values of the setup time, where the setup time corresponds to a charge/discharge time required for a latch within. The equation is listed as follows:

$$Q = I \times T = C \times V \Rightarrow (2I_d)(T_{setup}) =$$
$$C(V_{dd}) \Rightarrow T_{setup} = \frac{C(V_{dd})}{2I_d} = \frac{C(V_{dd})}{\mu_p C_{ox}\left(\frac{W}{l}\right)(V_{dd} - V_t)^2}; \Rightarrow T_{setup} \propto \frac{1}{V_{dd}}.$$

According to the above equation, the setup time is approximately inversely proportional to the voltage source $V_{dd}$ of the circuit. That is, if the value of the voltage source $V_{dd}$ is greater, the setup time is smaller.

Figure 5A:
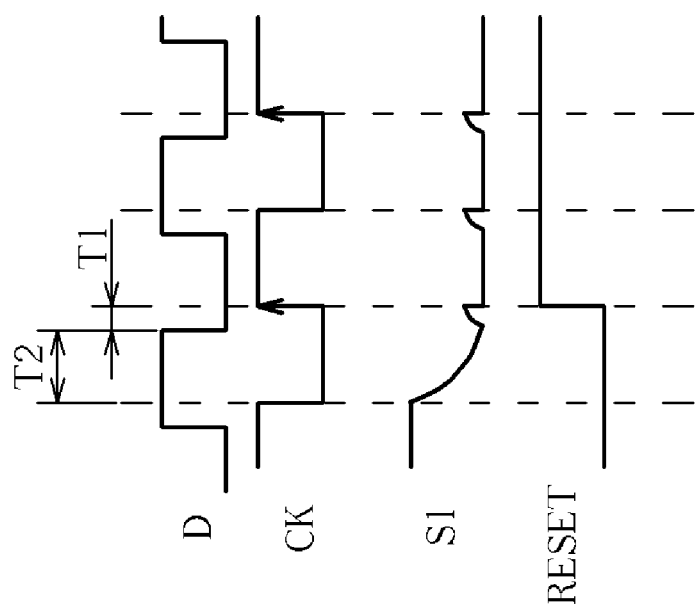
FIG. 5A illustrates voltage reset waveforms of the start-up reset circuit while a voltage level of a voltage source is less than a threshold voltage according to one embodiment of the present invention.

In an embodiment, the clock enabling input terminal CK is implemented with negative phase driving, so a phase difference between two phases that are respectively coupled to the data input terminal D and the clock enabling input terminal CK is at least 180 degrees. FIG. 5A illustrates waveforms of related signals of the flip-flop 310 together with the start-up reset signal RESET while a voltage level of the voltage source $V_{dd}$ is lower according to one embodiment of the present invention. When the voltage level of the voltage source $V_{dd}$ is lower, the setup time is correspondingly greater, and if an initial value of the node S1 is logic 1, it is possible that there is not enough time for the node S1 to discharge the voltage of the node S1 to a level under the threshold voltage $V_{th}$ since the time T2 may be less than the setup time, so the output signal of the data output terminal Q will still be 0. Therefore, the time T2 should be properly adjusted, so as to discharge the voltage of the node S1 to a level under the threshold voltage $V_{th}$. Additionally, the time T1 should be properly adjusted, so that the voltage of the node S1 will not be charged up to a level above the threshold voltage $V_{th}$ during this period of time. If the flip-flop 310 is driven under a certain voltage value of the operation voltage, and if the setup time of the flip-flop 310 is substantially equal to a time of the phase difference, the threshold voltage $V_{th}$ is substantially equal to a voltage level under the certain voltage value of the operation voltage. Thus, by changing the time of the phase difference, the threshold voltage $V_{th}$ can be adjusted.

Figure 5B:
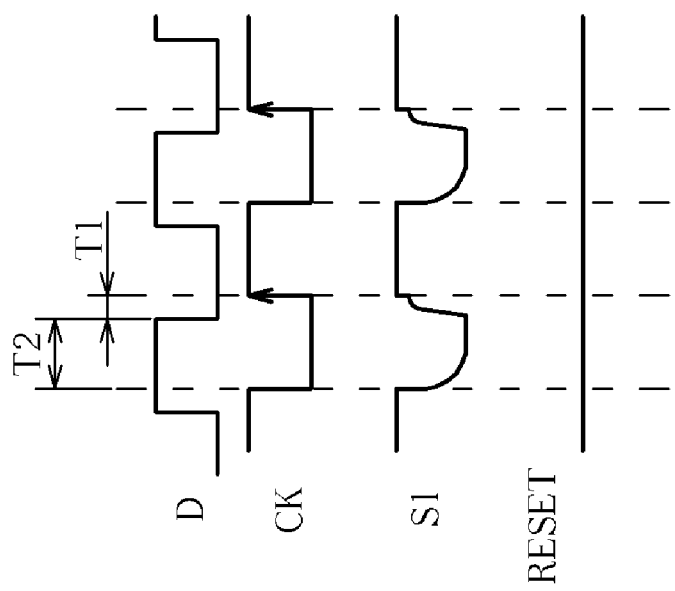
FIG. 5B illustrates voltage reset waveforms of the start-up reset circuit while a voltage level of the voltage source is greater than the threshold voltage according to another embodiment of the present invention.

As shown in FIG. 5B, when a value of the voltage source $V_{dd}$ is greater, the setup time is correspondingly smaller, so the voltage of the node S1 can be charged to a level above the threshold voltage $V_{th}$ during the time T1, causing the output signal of the data output terminal Q to be logic 0. Therefore, by utilizing the characteristics of the time T1 and the time T2, selection of the two phases X and Y to be coupled to the data input terminal D and the clock enabling input terminal CK can be determined.

According to the above descriptions, the present invention provides simpler circuits, which means the circuit scale is smaller and the power consumption is correspondingly lower. The present invention methods and circuits can be applied to the start-up reset function of digital circuits or analog circuits. In addition, by the phase difference adjustment of the two clock signals of the clock signal generator 320, the threshold voltage can be changed. Thus, the present invention can be applied to different voltage values of the voltage source $V_{dd}$ (e.g. 0.9, 1.2, 1.5, 1.8, 2.5, 3.3 and 5.0 volts), so as to generate the reset signal required. In other words, even if a lower voltage value of the voltage source $V_{dd}$ is given for driving the circuits, the present invention is still applicable. In another embodiment, by properly varying the present invention circuit(s), the clock enabling input terminal CK can be implemented with positive phase driving.

Those skilled in the art may derive some other detailed characteristics of the present invention method(s) according to the above disclosure related to the present invention circuits. Similar descriptions are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A start-up reset circuit, comprising:
  a clock signal generator, for generating a first clock signal and a second clock signal, wherein there is a phase difference between the first and the second clock signals, and a frequency of the first clock signal and a frequency of the second clock signal are substantially the same; and
  a circuit, receiving an operation voltage, the first and the second clock signals, and latching the first clock signal according to the second clock signal to output a reset signal, wherein a setup time of the circuit corresponds to the operation voltage, wherein when the operation voltage is greater than a threshold value, the reset signal turns from a first logic value to a second logic value, where the threshold value changes corresponding to the phase difference.

2. The start-up reset circuit of claim 1, wherein when a time of the phase difference is substantially equal to the setup time, the threshold value is substantially equal to a value of the operation voltage.

3. The start-up reset circuit of claim 1, wherein when the operation voltage is less than the threshold value, a time difference of the phase difference is less than the setup time.

4. The start-up reset circuit of claim 1, wherein the phase difference is greater than 180 degrees.

5. The start-up reset circuit of claim 1, wherein the circuit comprises a flip-flop, the flip-flop comprises an input terminal to receive the first clock signal, a clock input terminal to receive the second clock signal, and an output terminal to output a reset signal.

6. The start-up reset circuit of claim 5, wherein the flip-flop further comprises:
  a first latch for receiving the first and the second clock signals, wherein the first latch samples the first clock signal by utilizing the second clock signal to output a sample signal; and
  a second latch for receiving the sample signal and the second clock signal, wherein the second latch samples the sample signal by utilizing the second clock signal to output the reset signal.

7. The start-up reset circuit of claim 5, wherein when the operation voltage is greater than a threshold value, the reset signal turns from a first logic value to a second logic value.

8. The start-up reset circuit of claim 7, wherein when a time of the phase difference is substantially equal to the setup time, the threshold value is substantially equal to a value of the operation voltage.

9. The start-up reset circuit of claim 7, wherein when the operation voltage is less than the threshold value, a time difference of the phase difference is less than the setup time.

10. The start-up reset circuit of claim 1, wherein a voltage value of the operation voltage is one of 0.9, 1.2, 1.5, 1.8, 2.5, 3.3, and 5.0 volts.

11. A method for generating a start-up reset signal, comprising:
  generating a first clock signal and a second clock signal, wherein there is a phase difference between the first and the second clock signals, and a frequency of the first clock signal and a frequency of the second clock signal are substantially the same; and
  utilizing a circuit to latch the first clock signal according to the second clock signal to output a reset signal, wherein a setup time of the circuit corresponds to an operation voltage received by the circuit, wherein the operation voltage is greater than a threshold value, the reset signal turns from a first logic value to a second logic value; and
  adjusting the threshold value by changing the phase difference.

12. The method of claim 11, wherein when the operation voltage is less than the threshold value, a time difference of the phase difference is less than the setup time.

13. The method of claim 11, wherein when a time of the phase difference is substantially equal to the setup time, the threshold value is substantially equal to a value of the operation voltage.

14. The method of claim 11, further comprising:
  adjusting the threshold value according to a voltage value of the operation voltage.

15. The method of claim 11, wherein the phase difference is greater than 180 degrees.

16. The method of claim 11, wherein the circuit comprises a flip-flop.

17. The start-up reset circuit of claim 1, wherein the setup time corresponds to a charging/discharging time of the circuit and is inversely proportional to the operation voltage.

18. The method of claim 11, wherein the setup time corresponds to a charging/discharging time of the circuit and is inversely proportional to the operation voltage.

* * * * *